United States Patent
Nagaraj

[11] Patent Number: 5,990,744
[45] Date of Patent: Nov. 23, 1999

[54] WIDE BAND PROCESS INDEPENDENT GAIN CONTROLLABLE AMPLIFIER STAGE

[75] Inventor: Krishnaswamy Nagaraj, Somerville, N.J.

[73] Assignee: Lucent Technologies Inc., Murray Hill, N.J.

[21] Appl. No.: 08/975,806

[22] Filed: Nov. 21, 1997

[51] Int. Cl.⁶ .................................................. H03F 3/16
[52] U.S. Cl. ............................................ 330/277; 330/284
[58] Field of Search .................................. 330/277, 284, 330/296, 310, 311

[56] References Cited

U.S. PATENT DOCUMENTS 3,764,931  10/1973  Waku et al. .............................. 330/284
3,803,505   4/1974  Ishigaki et al. ...................... 330/284 X
3,913,026  10/1975  Koehler .................................... 330/277

Primary Examiner—Benny Lee
Assistant Examiner—Khanh Van Nguyen
Attorney, Agent, or Firm—Darby & Darby

[57] ABSTRACT

In an amplifier stage a first FET receives the input signal at its gate electrode. The drain of the first FET is connected to the drain of a second FET, and both drains are connected to the same drain voltage supply. The amplifier stage output is from the drain of the second FET. A third FET has its drain connected to the drain voltage supply and its source connected to the reference voltage supply. The physical characteristics of the third transistor are selected to produce a voltage of a fixed value that is applied as a bias to the source of the second transistor to compensate for an offset of the amplifier stage input signal voltage. A fourth FET has its drain connected to the drain voltage supply and its source connected to the drain of the third FET. The drain of the fourth FET is connected to the gate of the second FET. The physical characteristics of the fourth FET and the current flowing through it determine the gain of the amplifier stage. The third and fourth FETs are not in the signal path. Several stages can be connected in cascade with only one pair of said third and fourth transistors connected to the source and gate of the second transistor of each stage.

6 Claims, 1 Drawing Sheet

WIDE BAND PROCESS INDEPENDENT GAIN CONTROLLABLE AMPLIFIER STAGE

FIELD OF THE INVENTION

My invention relates to wideband amplifiers with increased stability.

BACKGROUND OF THE INVENTION

In applications such as fiber optic communication systems, a common type of amplifier is the so-called "trans-impedance amplifier". Such amplifiers have a relatively wideband frequency response and low noise. Stable gain for the amplifier is another desired characteristic. One stage of a trans-impedance amplifier is typically implemented by MOSFET technology using two field-effect transistors (FETs) of the same type. Several stages of this type are connected in cascade to complete the amplifier.

In a single stage of the amplifier, the input signal is applied to the input (gate) electrode of one FET whose output (drain) is connected to the input (gate) of the second FET. The first and second FETs are both operated in the common source mode, that is, their sources are connected to ground. The drain electrodes of the two transistors are connected together and are also connected to a drain voltage source. The amplified output signal is taken from the connected drain electrodes of the two FETS.

It is desirable for the trans-impedance amplifier gain to be constant when operating under varying ambient conditions. The gain depends on such factors as the physical characteristics of the transistors, the input current and the operating conditions. Any variation of the physical characteristics of one FET relative to another in an amplifier stage affects the stability of the overall amplifier gain. Also, the gain of an amplifier stage is sensitive to offsets of the input voltage. That is, if the input voltage has a quiescent voltage other than OV, then the amplifier will operate on portions of the gain curve other than where it was designed to operate and the gain will vary. Another disadvantage is that it is somewhat difficult to design such an amplifier to have a desired gain characteristic.

BRIEF DESCRIPTION OF THE INVENTION

My present invention is directed to an improved amplifier stage for a trans-impedance type amplifier. In a preferred embodiment of the amplifier stage, a first FET receives the input signal at its gate electrode. The drain of the first FET is connected to the drain of a second FET and both drains are connected to the same drain voltage source. A third FET transistor has its drain connected to the drain voltage source and its source connected to ground. This third FET develops a fixed value voltage that is applied tco the source of the second transistor. The characteristics of the third transistor are selected to produce a fixed value voltage which sets the gate-to-source bias voltage of the second transistor so it compensates for an offset of the input signal voltage.

A fourth FET has its drain connected to the drain voltage source and its source connected to the drain of the third FET. The drain of the fourth FET is connected to the gate of the second FET. The physical characteristics of the fourth FET and the current flowing through it determine the gain of the amplifier stage. The third and fourth FETs are not in the signal path and therefore do not affect the characteristics of the amplifier output signal.

The gain of the stage is stable and several stages may be connected in cascade to complete the trans-impedance amplifier.

OBJECTS OF THE INVENTION

It is therefore an object of my invention to provide a wideband trans-impedance type amplifier with stable amplification characteristics.

Another object is to provide an amplifier stage formed by two series coupled FETs in which other FETs are used to compensate for an offset in the amplifier input voltage and to control the amplifier gain.

An additional object is to provide an amplifier stage formed by first and second connected FET transistors in which a third FET transistor sets the source voltage of the second transistor and the characteristics of a fourth FET transistor, which also determines the current flowing through the fourth FET transistor, controls the gain of the amplifier stage.

BRIEF DESCRIPTION OF THE DRAWINGS

Other objects and advantages of the present invention will become more apparent upon reference to the following specification and annexed drawings, in which.

BRIEF DESCRIPTION OF THE INVENTION

Figure 1:
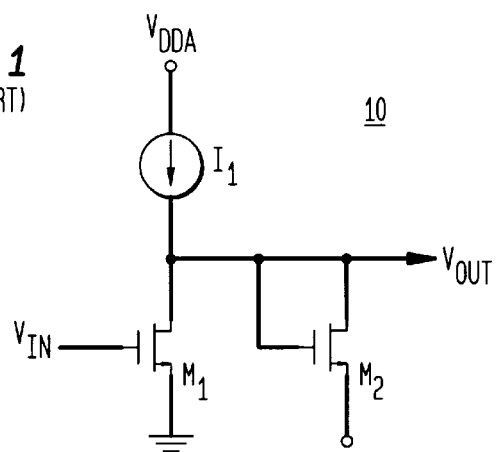
FIG. 1 is a schematic circuit diagram of a conventional trans-impedance amplifier stage formed by two FETs.

FIG. 1 shows the circuit schematic of a prior art trans-impedance amplifier stage that is often implemented by CMOS technology. Amplifier 10 has two MOSFET transistors, $M_1$ and $M_2$, connected such that: the source electrode of each transistor is grounded and the gate of $M_1$ receives the input signal $V_{in}$. The drain of $M_1$ is connected to the gate of $M_2$ and the drain electrodes of both $M_1$ and $M_2$ are supplied with the operating voltage $V_{DD}$. The drain current is shown as $I_1$. The amplifier output is from the drain of $M_2$. An important application of such an amplifier stage is in wide band trans-impedance amplifiers.

The following MOS transistor parameters apply to each of the transistors $M_1$ and $M_2$ of amplifier stage 10:

VGS=gate-source voltage gm=transconductance gds=output conductance

K=conductance parameter, which is proportional to the physical width-by-length ratio of the transistor on the chip VT=threshold voltage at which the transistor becomes conductive The voltage gain of the amplifier stage 10 is equal to $$\frac{gm_1}{gm_2}$$

which, in this case, can be shown to be equal to $$\frac{K_1}{K_2}$$

This value is independent of chip processing and ambient operating condition variations.

Figure 2:
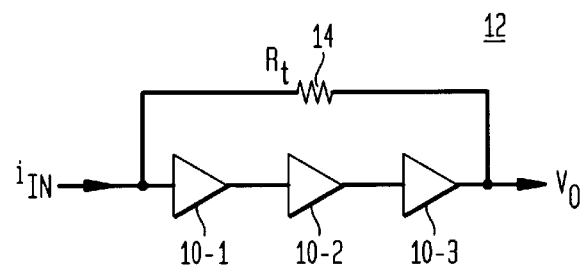
FIG. 2 is a schematic showing the coupling of several stages of the amplifier of FIG. 1.

Several such amplifier stages 10 of FIG. 1 are typically connected in cascade to form a trans-impedance amplifier 12, as shown in FIG. 2. A feedback resistor 14 connects the output of the last stage to the input of the first stage. While three stages of amplifiers 10-1, 10-2 and 10-3 are shown, there can be fewer or more stages.

As long as each of the connected amplifier stages 10 in FIG. 2 are identical or scaled versions of each other, the quiescent voltages at all the nodes of the connected stages, i.e., the points of connection of the output of one stage to the input of the next stage, will be equal. This means that in each amplifier stage 10, the transistors $M_1$ and $M_2$ (see FIG. 1) have the same gate-source voltage (VGS), making their respective drain currents proportional to their physical width-by-length ratios.

In practice, mismatches between the individual stages 10 of the trans-impedance amplifier 12 cause the node voltages to be unequal. This in turn prevents the ratio of the drain currents in transistors $M_1$ and $M_2$ of a stage 10 of amplifier 12 from being proportional to their physical width-by-length ratios. That is, the input signal level to each of the various stages will be different, thereby causing different currents to flow.

In an amplifier stage 10, $M_2$ is typically made much smaller physically than $M_1$. This makes $K_2$ smaller than $K_1$ so that, according to equation (2), the gain of the stage 10 is increased. Even a relatively small variation in the drain current of $M_1$ can cause a large variation in the current in $M_2$ because $M_1$ is physically larger than $M_2$ and affects proportionately more of the drain current that is common to both $M_1$ and $M_2$. This not only affects the voltage gain of the amplifier stage 10, but also the output resistance which in turn affects the response characteristics of the amplifier stage to an alternating or binary type input signal.

Another problem with the amplifier stage 10 of FIG. 1 is that there is no way of controlling its gain except by using switches to change transistors. That is, one of the two transistors $M_1$ and $M_2$ would be changed to one having a higher or lower K. However, switches in the signal path degrade the frequency of operation of an amplifier in which the stage is used. Similarly, in FIG. 2, one or more of the stages 10 can be changed by switching to stages having different gain. But the same problem produced by switching would be present.

Figure 3:
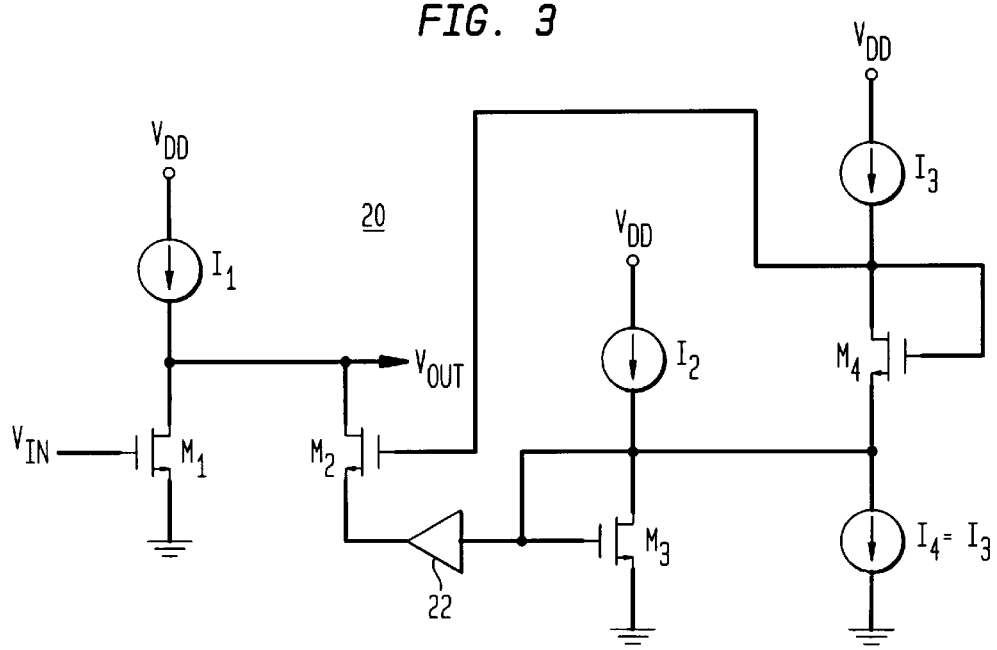
FIG. 3 is a schematic circuit diagram of an amplifier stage according to my present invention.

An improved amplifier stage 20 in accordance with the invention is shown in FIG. 3. Several of these improved stages would be connected in cascade in the manner as shown in FIG. 2.

In FIG. 3, transistor $M_1$ receives the input voltage $V_{in}$ at its gate, the source is grounded and the drain is connected to voltage source $V_{DD}$. The drain of $M_1$ is connected to the drain of $M_2$ which also receives the voltage $V_{DD}$. There is a common drain current $I_1$. The output $V_{out}$ of the stage 20 is at the $M_1$–$M_2$ drain junction connection.

The source and gate voltages for $M_2$ are controlled by FET transistors $M_3$ and $M_4$. These transistors are connected with the source of $M_3$ grounded and the drain receiving voltage $V_{DD}$ such that a current $I_2$ flows. The drain of $M_3$ is also connected to its gate.

For transistor $M_4$, the gate and drain are connected together and the drain is connected to the voltage source $V_{DD}$. There is a drain current $I_3$ for $M_4$. The source of $M_4$ is connected to the drain of transistor $M_3$. The measured current between the source of $M_4$ and ground is shown as $I_4$. $I_3=I_4$ when transistor $M_4$ conducts.

The function of $M_3$ is to set the source of $M_2$ at a fixed level as determined by $M_3$. This level can be, for example, the quiescent level of $V_{in}$. $I_2$ and the characteristics of transistor $M_3$ are used for developing a dc voltage that is equal to the quiescent value of $V_{in}$. A buffer 22 connects the gate-drain junction of $M_3$ to the source of $M_2$. Effectively, $M_3$ develops a fixed voltage above 0 V from its gate to ground and this fixed voltage of $M_3$ sets the source voltage and VGS of $M_2$.

The gate of $M_2$ is connected to the drain and gate of $M_4$. The two currents $I_3$ and $I_4$ of $M_4$ are adjustable by selecting the characteristics of $M_4$, but these currents are always equal. This ensures that the current in $M_3$ is always equal to the desired value of $I_2$ so that the desired voltage can be developed across $M_3$ to be applied to the source of $M_2$.

For the amplifier stage circuit 20 of FIG. 3, the following expressions apply:

$$gm_1 = \sqrt{K_1 I_1}$$

$$VGS_2 = VGS_4 \quad (4)$$

since the gate of $M_2$ is connected to the gate $M_4$ and the source of $M_4$ is connected to the source of $M_2$, through the buffer 22. Also, $$gds_2 = 2K_2(VGS_2 - V_T) \quad (5)$$

That is, the output conductance of $M_2$ varies as a function of $VGS_2$, which, as shown in (4), is the same as $VGS_4$. $V_T$ is the threshold voltage of conduction for the entire stage 20.

It can be shown that:

$$gm_4 = 2K_4(V_2 - V_T) = 2\sqrt{K_4 I_3}$$

in which $V_2$ is the voltage across $M_3$ that is applied to the source of $M_2$, and that $$gds_2 = 2\frac{K_2}{K_4}\sqrt{K_4 I_3}$$

The signal $V_{in}$ passes only through amplifier 20 stage transistors $M_1$ and $M_2$. From (5), (6) and (7) the gain of amplifier 20 is $$\text{Voltage gain} = \frac{gm_1}{gds_2} = \frac{\sqrt{K_1 K_4}}{K_2} \frac{\sqrt{I_1}}{I_3}$$

The voltage gain of amplifier stage 20 of FIG. 3, as shown in (8), is independent of processing and ambient conditions. However, there are some important differences from stage 10 of FIG. 1. First, in the amplifier stage 20 of FIG. 3, any offset in the characteristics of $M_2$ from $M_1$, can only cause a small change in gain, because its only effect would be to cause a small change in $VGS_2$. $VGS_2$ is basically set by $M_3$ which is independent of the physical characteristics of $M_2$.

Second, the gain of stage 20 can be controlled by adjusting $I_3$ (and $I_4$) and $K_4$. These parameters can be controlled without affecting the high frequency performance of the amplifier since there are no changes to the physical parameters of $M_1$ and $M_2$.

As can be seen, the voltage gain of stage 20 is affected by the K value of $M_4$, which is a function of the physical parameters of $M_4$. Another factor is the current $I_3$, which is a function of the physical characteristics of both $M_3$ and $M_4$. Accordingly, the gain of the amplifier stage 20 can be controlled by properly selecting the physical characteristics of $M_3$ and $M_4$.

Also, as can be seen, $M_3$ and $M_4$ are not in the path of the signal being amplified. Therefore, they do not affect the amplifier frequency response characteristics.

A multi-stage amplifier as in FIG. 2 can be constructed with stages made in accordance with FIG. 3. With such an arrangement, there would be several stages of FETs $M_1$ and $M_2$ connected in series and only one set of FETs $M_3$ and $M_4$. The output of $M_3$ would be connected to the source electrodes of $M_2$ of each of the stages. Thus, each stage has the same VGS. The drain of $M_4$ is connected to the gate of $M_2$ of each of the stages. Thus, the gain of each stage is controlled by the parameters of $M_4$, as per equation (8).

Specific features of the invention are shown in one or more of the drawings for convenience only, as each feature may be combined with other features in accordance with the invention. Alternative embodiments will be recognized by those skilled in the art and are intended to be included within the scope of the claims.

I claim:

1. An amplifier for amplifying an input signal comprising:
   a first transistor for receiving the input signal and a second transistor connected to said first transistor to serve as a variable resistance load, and
   third and fourth transistors connected in series between an operating voltage supply and a reference voltage supply, a fixed non-zero voltage being developed by said third transistor and applied to one electrode of said second transistor to set a bias voltage therefor,
   said fourth transistor producing a voltage that is applied to another electrode of said second transistor, the voltages applied to said one and said another electrode of said second transistor controlling its resistance, wherein said transistors are of the field effect type having a source, a drain and a gate as an input, the voltage developed by said third transistor being applied to set a bias at one of said source and drain of said second transistor and the voltage produced by said fourth transistor applied to the gate of said second transistor.

2. An amplifier as in claim 1 wherein the voltage produced by said fourth transistor is applied to the gate of said second transistor.

3. An amplifier as in claim 2 wherein the voltage produced by said fourth transistor is applied to the gate of said second transistor.

4. An amplifier for amplifying an input signal comprising:
   first, second, third and fourth transistors, each having a source, a drain and a gate;
   said first transistor having its gate connected to receive the input signal, its source connected to a reference voltage supply and its drain connected to an operating voltage supply and to the drain of said second transistor, at which an amplified version of the input signal appears,
   said fourth transistor having its drain connected to the operating voltage supply and to the gate of said second transistor, its source connected to the drain of said third transistor and its source connected to the reference voltage supply, and
   said third transistor having its gate connected to the source of said second transistor to set the gate-to-source bias voltage of said second transistor.

5. An amplifier as in claim 4 wherein each of said first, second, third and fourth transistors is of the field effect type and the gain of the amplifier is $$\text{Voltage gain} = \frac{gm_1}{gds_2} = \frac{\sqrt{K_1 K_4}}{K_2} \frac{\sqrt{I_1}}{I_3}$$

gm=transconductance, gds=output conductance,

K=conductance parameter, which is proportional to the physical width-by-length ratio of the transistor on the chip, current flowing through the transistor, and the subscript numbers 1, 2, 3 and 4 corresponding to the first, second, third and fourth transistors, respectively.

6. An amplifier comprising a plurality of stages of the amplifier of claim 4 connected in cascade.

\* \* \* \* \*